(12) United States Patent
Berge et al.

(10) Patent No.: US 10,110,116 B1
(45) Date of Patent: Oct. 23, 2018

(54) IMPLEMENTING VOLTAGE SENSE POINT SWITCHING FOR REGULATORS

(71) Applicant: International Business Machines Corporation, Armonk, NY (US)

(72) Inventors: Layne A. Berge, Rochester, MN (US); Patrick K. Egan, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/621,560

(22) Filed: Jun. 13, 2017

(51) Int. Cl.
*H02M 1/32* (2007.01)
*H03K 17/082* (2006.01)
*H03K 17/16* (2006.01)
*H02M 1/00* (2006.01)

(52) U.S. Cl.
CPC .......... *H02M 1/32* (2013.01); *H03K 17/0822* (2013.01); *H03K 17/165* (2013.01); *H02M 2001/0054* (2013.01); *H03K 2217/0027* (2013.01)

(58) Field of Classification Search
CPC ............. H03K 17/0822; H03K 17/165; H03K 2217/0027; H02M 1/32; H02M 2001/0054
See application file for complete search history.

(56) References Cited

U.S. PATENT DOCUMENTS

| | | | |
|---|---|---|---|
| 3,631,352 A | 12/1971 | Kelley et al. | |
| 4,030,039 A | 6/1977 | Fahlgren | |
| 4,318,007 A | 3/1982 | Rizzi | |
| 5,652,501 A | 7/1997 | McClure et al. | |
| 5,977,757 A * | 11/1999 | Felps | G05F 1/613 323/282 |
| 5,986,902 A | 11/1999 | Brkovic et al. | |
| 7,102,338 B2 | 9/2006 | Osburn et al. | |
| 7,135,842 B2 * | 11/2006 | Banerjee | G05F 1/56 323/275 |
| 7,741,736 B2 | 6/2010 | Clemo et al. | |
| 8,836,414 B2 * | 9/2014 | Fefer | G05F 1/565 327/538 |
| 9,787,110 B2 * | 10/2017 | Peabody | H02J 7/0027 |

FOREIGN PATENT DOCUMENTS

| | | |
|---|---|---|
| JP | 54079537 A | 6/1979 |
| JP | 59165566 A | 9/1984 |
| KR | 1020010008471 A | 2/2001 |
| WO | WO2007082778 A1 | 7/2007 |

* cited by examiner

*Primary Examiner* — Nguyen Tran
*Assistant Examiner* — Jye-June Lee
(74) *Attorney, Agent, or Firm* — Joan Pennington

(57) ABSTRACT

A method and circuit are provided for implementing voltage sense point switching for regulators. A regulator voltage sensing circuit includes at least two sense points enabling a regulator to compensate for voltage drop at the sense points and providing at least one of the sense points at a location to be switched. Switched loads have gains at the sense points to compensate for the voltage drop in a transistor switch at maximum load. A non-switched output is sensed and functions as an over-voltage protection to limit the transistor switch voltage drop.

17 Claims, 5 Drawing Sheets

IMPLEMENTING VOLTAGE SENSE POINT SWITCHING FOR REGULATORS

FIELD OF THE INVENTION

The present invention relates generally to the data processing field, and more particularly, relates to method and circuit for implementing voltage sense point switching for regulators.

DESCRIPTION OF THE RELATED ART

Various regulator arrangements are known in the art. On high-power regulator designs, resistive losses (IR) from the output of the regulator to the load point start becoming an issue.

Vias, copper losses, series sense resistors and or switches all contribute to these losses. When the voltage at the point of load becomes too low, the load might fail to operate correctly. For instance, a processor when run at too low of a voltage may begin to miss timing, resulting in a failure to operate.

One option to correct output load voltage is to turn up the regulator to account for loss. This however is limited to the maximum input voltage of the devices connected to the voltage domain. With smaller critical dimensions used in semiconductor manufacturing along with thinner gate oxides, the maximum voltage possible is rapidly decreasing, diminishing the effectiveness of this approach.

Sense lines attempt to remedy this issue by offering feedback to the regulator. When the voltage drops at the point of load, the regulator dynamically increases its output in order to compensate. Conversely, when the current demand drops and the voltage at the point of load increases, the regulator sees this and turns down its output voltage. This allows the regulator to safely output a higher voltage than allowed by the load because the regulator compensates when the load decreases.

Sense lines, however, typically only work at one point. If, for instance, a domain is sourced through a field effect transistor (FET) switch from the same regulator, the voltage on either side of the switch could be vastly different. If compensation is attempted with sense lines on one side of the FET switch, the other side may either be in an over-voltage or and under-voltage state.

A need exists for an efficient and effective method and circuit for implementing voltage sense point switching for regulators. It is desirable to sense voltage at multiple points, for example using a multiplexer or logic circuit for determining highest and lowest voltages of a domain.

SUMMARY OF THE INVENTION

Principal aspects of the present invention are to provide a method and circuit for implementing voltage sense point switching for regulators, and a design structure on which the subject circuit resides are provided. Other important aspects of the present invention are to provide such method and circuit substantially without negative effects and that overcome many of the disadvantages of prior art arrangements.

In brief, a method and circuit are provided for implementing voltage sense point switching for regulators. A regulator voltage sensing circuit includes at least two sense points enabling a regulator to compensate for voltage drop at the sense points and providing at least one of the sense points at a location to be switched. Switched loads have gains at the sense points to compensate for the voltage drop in a transistor switch at maximum load. A non-switched output is sensed and functions as an over-voltage protection to limit the transistor switch voltage drop.

In accordance with features of the invention, the transistor switch includes a field effect transistor (FET) switch, such as an N-channel field effect transistor (NFET) switch.

In accordance with features of the invention, the switched sense point location is connected to the FET switch.

In accordance with features of the invention, an analog switching network is provided for each of the multiple voltage sense points.

In accordance with features of the invention, each analog switching function includes a respective diode function. The respective diode function is implemented using a respective operational amplifier and a respective diode connected to an output of the respective operational amplifier.

In accordance with features of the invention, each respective operational amplifier includes biasing and feedback resistors to compensate for loss across the transistor switch and to avoid an over-voltage condition.

In accordance with features of the invention, with two sense points, inputs from the two sense points are applied to each respective operational amplifier.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
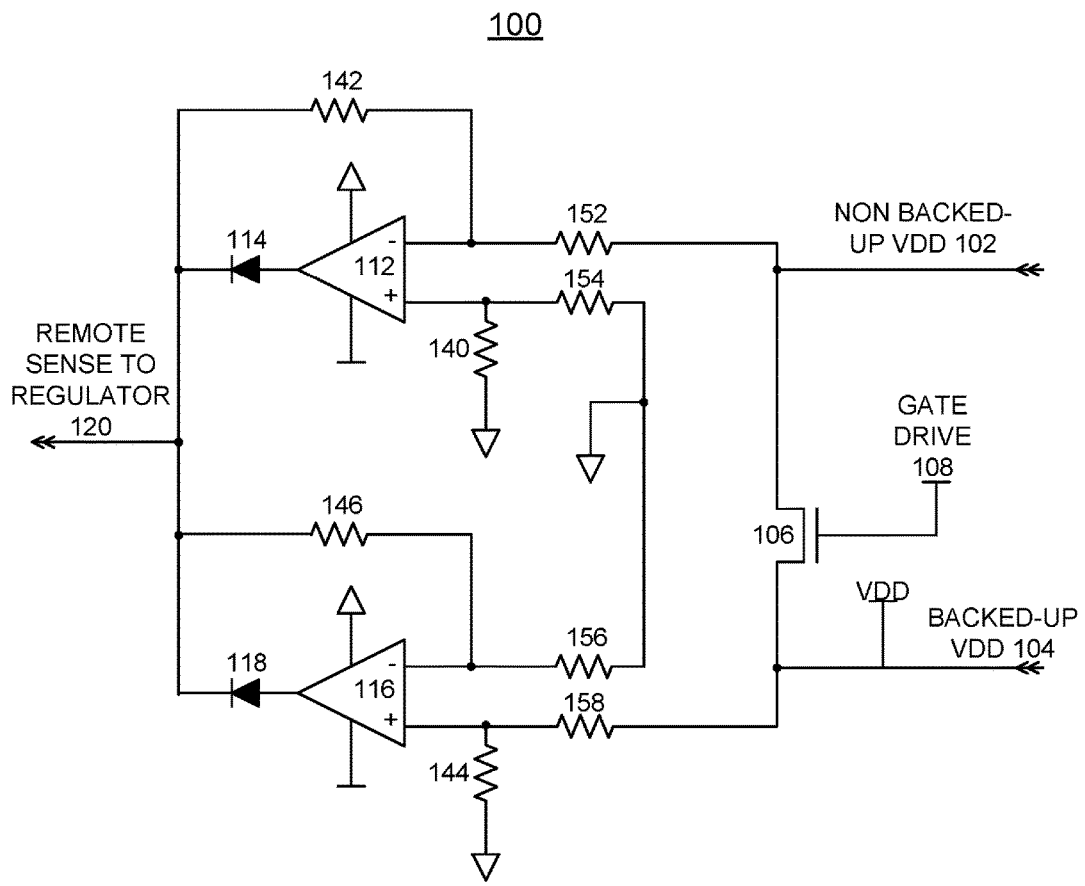
FIG. 1 illustrates an example regulator voltage sensing circuit to switch between two sense points in accordance with a preferred embodiment.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention. In particular, references to "file" should be broadly considered to include and may be substituted with block, page or any other logical subdivision of data.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit are provided for implementing voltage sense point switching for regulators. A regulator voltage sensing circuit includes at least two sense points enabling a regulator to compensate for voltage drop at the sense points and allowing for at least one of the sense points provided at a location to be switched. Switched loads have gains at the sense points to make up for the voltage drop in a transistor switch at maximum load. A non-switched output is sensed and functions as an over-voltage protection to limit the transistor switch voltage drop.

In accordance with features of the invention, the circuit enables a regulator to compensate for voltage drop at two or more locations and allows for one or more of these locations to be switched, where switched loads have gains at the sense points to make up for the voltage drop in the switch at maximum load; and where the non-switched output is still sensed and works as an over-voltage protection in case a transistor switch drops too much voltage.

Having reference now to the drawings, in FIGS. 1-4 there is shown an example regulator voltage sensing circuit generally designated by the reference character 100 in accordance with a preferred embodiment. Regulator voltage sensing circuit 100 includes two sense points including 102, NON-BACKED UP VDD, and 104, BACKED-UP VDD. Regulator voltage sensing circuit 100 includes a field effect transistor (FET) switch 106 having a gate input 108 and a drain source connection between the sense points 102, NON-BACKED UP VDD, and 104, BACKED-UP VDD. A portion of the VDD domain including the sense point 102, NON-BACKED UP VDD is switched using the FET switch 106, such as implemented by an N-channel FET or NFET 106. The sense point 104, BACKED UP VDD always remains on, while the sense point 102, NON-BACKED UP VDD optionally is switched off. This is controlled using the FET switch 106. The FET switch 106 includes some inherent loss. This FET switch loss, with high-current demands, can be enough to drive the voltage on a non-backed-up domain portion including the sense point 102, NON-BACKED UP VDD below the minimum voltage threshold acceptable to an attached load, such as a processor load.

Regulator voltage sensing circuit 100 implements multiple regulator sense points with a diode and operational amplifier creating an analog switching network for the multiple voltage sense points.

Regulator voltage sensing circuit 100 includes a respective ideal diode or diode function for multiple voltage sense points implemented using a respective operational amplifier (op-amp) 112, 116 and a respective diode 114, 118, to create an analog switching network, or the two voltage sense points 102, 104, as shown.

In accordance with features of the invention, an ideal diode is created by the combination of the diodes 114, 118 and the respective op-amps 112, 116 where the voltage drop across the diodes 114, 118 is compensated by respective op-amps to provide the effect of 0V drop or an ideal diode. Also the op-amps must have low offset inputs, and the question why not to just turn up the regulator is that while both domains are at full-current, the benefit is marginal. However, if the load was not significant, the regulator would be able to save power by not operating at a higher voltage and to also extend the life of the load attached by not stressing the silicon.

An output 120 of circuit 100 is labeled REMOTE SENSE TO REGUALTOR. Each of the op-amps 112, 116 includes a pair of respective bias/and feedback resistors 140, 142, and 144, 146. Each of the op-amps 112, 116 includes a pair of respective input resistors 152, 154, and 156, 158.

In accordance with features of the invention, the two op-amps 112, 116 accept inputs from the two sense points 102, 104. The output 120 of the circuit 100 is the higher of the two sense points 102, 104. This is useful in situations where one sense point of the two sense points 102, 104 will always be lower than the other. This is true when part of a domain is sourced through the FET switch 106 of the two sense points 102, 104, as shown.

When placing a sense line conventionally the design is limited to only placing the sense point on the Backed up domain. If the sense line is placed on the non-backed-up domain, when the FET switch is off, the domain goes to GND. This would cause the regulator using the sense line to increase its own output voltage to compensate. When the non-backed-up domain is not connected to the sense point, the regulator would keep on increasing its voltage until catastrophic damage occurred. Limiting the sense point to the backed up side, however, means that if the non-backed-up domain has a higher current demand than the backed up domain, compensation is not provided for the losses across the switch.

In accordance with features of the invention, regulator voltage sensing circuit 100 of FIG. 1 allows both sense points 102, 104 to be seen by the regulator.

Figure 2:
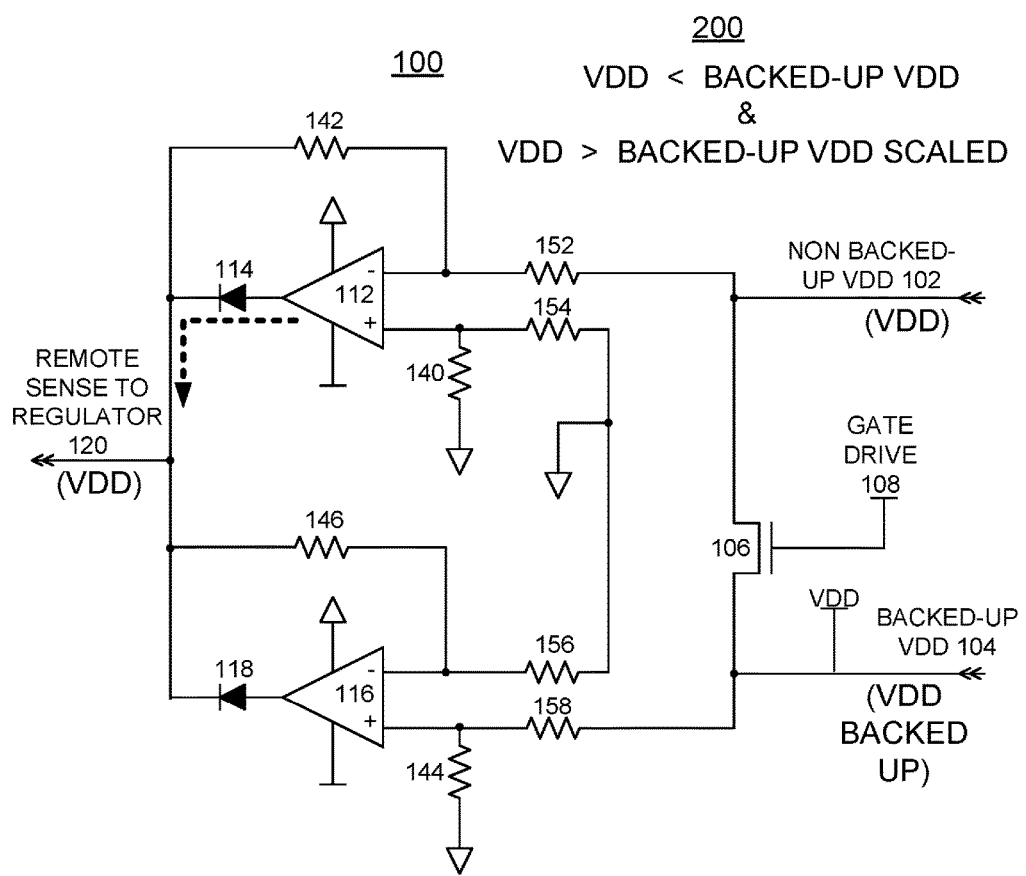
FIG. 2 illustrates regulator voltage sensing circuit operation of FIG. 1 when VDD non-backed-up is being sensed in accordance with a preferred embodiment.

Referring to FIG. 2, regulator voltage sensing circuit operation generally designated by the reference character 200 of circuit 100 includes VDD (input 102)<BACKED-UP VDD (at 104) and VDD (output 120)>SCALED BACKED-UP VDD. Assuming that FET switch 106 exhibits an R_DC of 1 mOhm and that the non-backed-up domain requires 30 A, while the backed-up domain only requires 5 A, the FET switch 106 will have an IR loss of 30 mV. For a 0.9 V domain, this is a 3.3% loss, which consumes most of a domains 5% voltage tolerance. With resistors 146 and 144 set to a value under 1K Ohm, the op-amp 116 scales down the voltage on the backed-up VDD domain. This allows op-amp 114 driving the regulator's sense point at output 120. If the backed up domain's voltage was not scaled, the non-backed-up domain would always be lower than the backed up domain (lower current in backed up domain in addition to the loss in FET switch 106). The scaling is done in order to allow proper compensation. For example, the scaling is done in order to compensate for the switch loss but also to protect the backed-up domain's maximum voltage tolerance.

Figure 3:
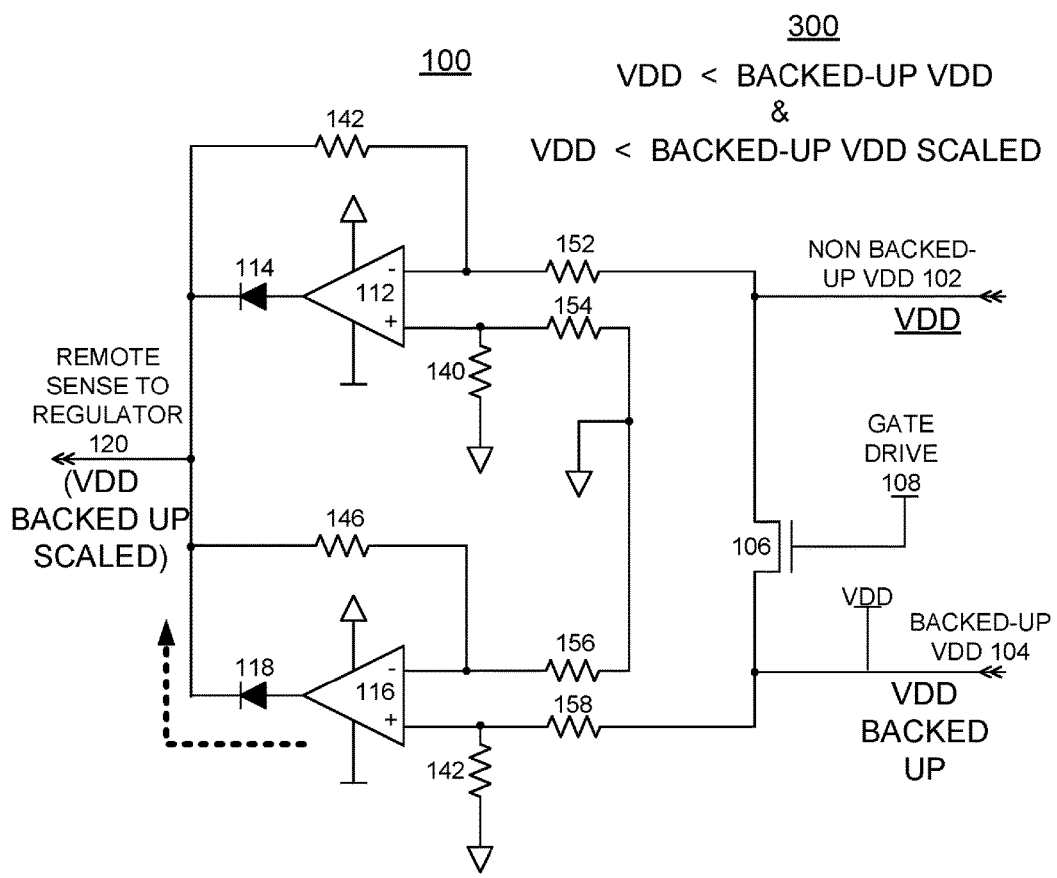
FIG. 3 illustrates regulator voltage sensing circuit operation of FIG. 1 when VDD backed-up is being sensed in accordance with a preferred embodiment.

Referring to FIG. 3, regulator voltage sensing circuit operation generally designated by the reference character 300 of circuit 100 includes VDD (input 102)<BACKED-UP VDD (input 104) and VDD (at 102)<SCALED BACKED-UP VDD (output 120). When VDD keeps dropping in voltage, either because FET switch 106 is now off or there is an over-current condition on the domain, the scaled version of VDD backed-up now becomes greater than VDD, allowing the VDD backed-up domain to be driving the sense point 120 to the regulator. The scaling of the resistors 146, 142 servicing op-amp 106 is provided to both compensate for the loss across FET switch 106 and to protect VDD backed-up from an over-voltage condition.

Figure 4:
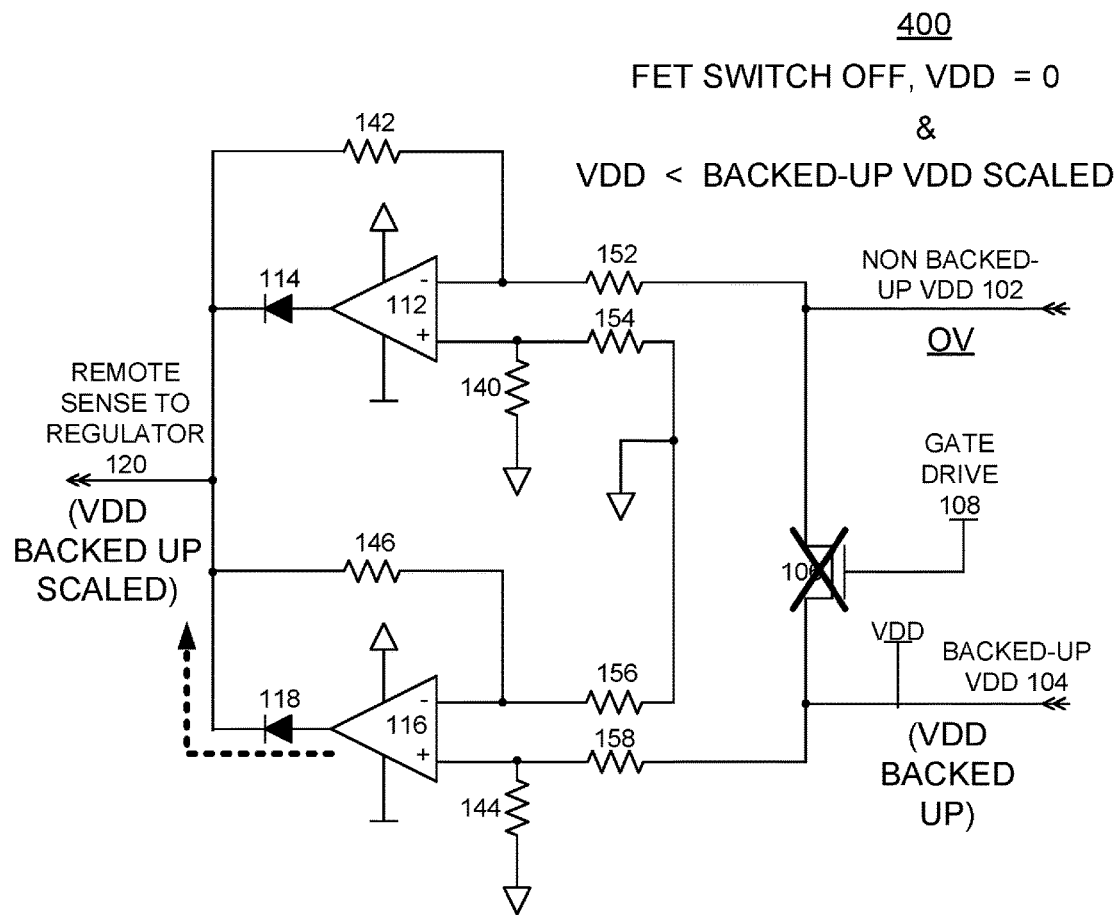
FIG. 4 illustrates regulator voltage sensing circuit operation of FIG. 1 with a field effect transistor (FET) switch turned off.

Referring to FIG. 4, regulator voltage sensing circuit operation generally designated by the reference character 400 of circuit 100 includes the FET switch 106 turned off, indicated by an X. With the FET switch 106 turned off, only the VDD backed up domain (input 104) is being sensed, as shown in FIG. 4. The non-backed-up domain (input 102)

will not be allowed to drive the regulator's sense point (output 120) until the FET switch 106 is turned back on and its voltage exceeds that of the scaled version of the backed-up domain.

Figure 5:
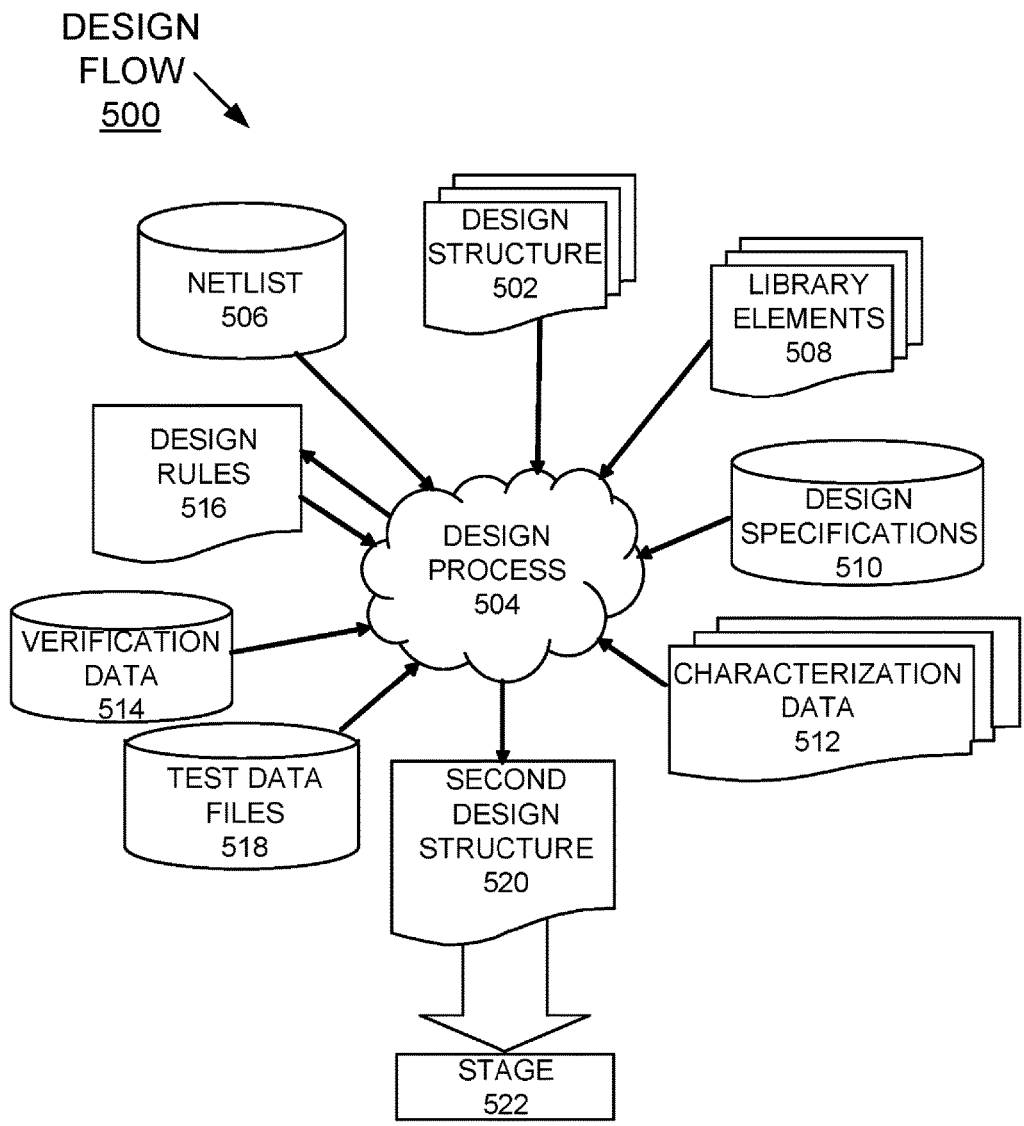
FIG. 5 is a flow diagram of a design process used in semiconductor design, manufacturing, and/or test.

FIG. 5 shows a block diagram of an example design flow 500. Design flow 500 may vary depending on the type of IC being designed. For example, a design flow 500 for building an application specific IC (ASIC) may differ from a design flow 500 for designing a standard component. Design structure 502 is preferably an input to a design process 504 and may come from an IP provider, a core developer, or other design company or may be generated by the operator of the design flow, or from other sources. Design structure 502 comprises circuit 100 in the form of schematics or HDL, a hardware-description language, for example, Verilog, VHDL, C, and the like. Design structure 502 may be contained on one or more machine readable medium. For example, design structure 502 may be a text file or a graphical representation of circuit 100. Design process 504 preferably synthesizes, or translates, circuit 100 into a netlist 506, where netlist 506 is, for example, a list of wires, transistors, logic gates, control circuits, I/O, models, etc. that describes the connections to other elements and circuits in an integrated circuit design and recorded on at least one of machine readable medium. This may be an iterative process in which netlist 506 is resynthesized one or more times depending on design specifications and parameters for the circuit.

Design process 504 may include using a variety of inputs; for example, inputs from library elements 508 which may house a set of commonly used elements, circuits, and devices, including models, layouts, and symbolic representations, for a given manufacturing technology, such as different technology nodes, 32 nm, 45 nm, 50 nm, and the like, design specifications 510, characterization data 512, verification data 514, design rules 516, and test data files 518, which may include test patterns and other testing information. Design process 504 may further include, for example, standard circuit design processes such as timing analysis, verification, design rule checking, place and route operations, and the like. One of ordinary skill in the art of integrated circuit design can appreciate the extent of possible electronic design automation tools and applications used in design process 504 without deviating from the scope and spirit of the invention. The design structure of the invention is not limited to any specific design flow.

Design process 504 preferably translates an embodiment of the invention as shown in FIGS. 1-4 along with any additional integrated circuit design or data (if applicable), into a second design structure 520. Design structure 520 resides on a storage medium in a data format used for the exchange of layout data of integrated circuits, for example, information stored in a GDSII (GDS2), GL1, OASIS, or any other suitable format for storing such design structures. Design structure 520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-4. Design structure 520 may then proceed to a stage 522 where, for example, design structure 520 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing voltage sense point switching for regulators comprising:
   enabling a regulator to compensate for voltage drop at least two sense points;
   providing at least one of said sense points at a location to be switched;
   providing switched loads having gains at said sense point to compensate for voltage drop in a transistor switch at maximum load;
   sensing said non-switched output for providing over-voltage protection to limit voltage drop of said transistor switch;
   providing an analog switching network including a respective diode function for multiple voltage sense points, and implementing said respective diode function using a respective operational amplifier and a respective diode connected to an output of said respective operational amplifier.

2. The method as recited in claim 1, includes providing said transistor switch with a field effect transistor (FET) switch.

3. The method as recited in claim 2, includes providing an N-channel field effect transistor (NFET) switch.

4. The method as recited in claim 2, includes said switched sense point location connected to said FET switch.

5. The method as recited in claim 1, includes providing two sense points and providing inputs from said two sense points to each said respective operational amplifier.

6. The method as recited in claim 1, includes providing 0 volts loss across said respective diode using compensation with said respective operational amplifier.

7. The method as recited in claim 1, includes providing biasing and feedback resistors with said respective operational amplifier to compensate for loss across said transistor switch and to avoid an over-voltage condition.

8. The method as recited in claim 1, includes turning off said transistor switch and only sensing said non-switched sense point.

9. The method as recited in claim 8, includes only allowing said switched sense point to be sensed until said transistor switch is turned back on and its voltage exceeds a threshold value.

10. A circuit for implementing voltage sense point switching for regulators comprising:
    at least two sense points enabling a regulator to compensate for voltage drop at the sense points;
    at least one of the sense points provided at a location to be switched;
    switched loads having gains at the sense points to make up for the voltage drop in a transistor switch at maximum load; and
    a non-switched sense point functions as an over-voltage protection to limit the transistor switch voltage drop; and
    an analog switching network for each of said multiple voltage sense points, each said analog switching function includes a respective diode function, and said respective diode function implemented using a respective operational amplifier and a respective diode connected to an output of said respective operational amplifier.

11. The circuit as recited in claim 10, wherein said transistor switch includes a field effect transistor (FET) switch.

12. The circuit as recited in claim 10, wherein said transistor switch includes an N-channel field effect transistor (NFET) switch.

13. The circuit as recited in claim 11, wherein said switched sense point location is connected to said FET switch.

14. The circuit as recited in claim 10, wherein said respective operational amplifier includes biasing and feedback resistors to compensate for loss across said transistor switch and to avoid an over-voltage condition.

15. The circuit as recited in claim 10, includes two sense points and inputs from said two sense points are applied to each said respective operational amplifier.

16. The circuit as recited in claim 10, includes only sensing said non-switched sense point responsive to turning off said transistor switch.

17. The circuit as recited in claim 15, includes only sensing said switched sense point until said transistor switch is turned back on and its voltage exceeds a threshold value.

* * * * *